United States Patent
Lo et al.

(10) Patent No.: US 8,370,788 B2
(45) Date of Patent: Feb. 5, 2013

(54) CIRCUIT DESIGN CHANGE AND CORRESPONDENCE POINT FINDING METHOD BETWEEN HDL LAND RLT DESIGN

(75) Inventors: Chen-Hsing Lo, Hsinchu Hsien (TW); Chien-Pang Lu, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 261 days.

(21) Appl. No.: 12/698,468

(22) Filed: Feb. 2, 2010

(65) Prior Publication Data

US 2010/0281443 A1 Nov. 4, 2010

(30) Foreign Application Priority Data

Apr. 30, 2009 (TW) .............................. 98114441 A

(51) Int. Cl.
G06F 11/22 (2006.01)

(52) U.S. Cl. ..................... 716/136; 716/102; 716/134

(58) Field of Classification Search .................. 716/100, 716/102, 134, 136
See application file for complete search history.

(56) References Cited

U.S. PATENT DOCUMENTS

| 6,530,073 | B2 * | 3/2003 | Morgan | 716/102 |
| 2002/0162086 | A1 * | 10/2002 | Morgan | 716/18 |
| 2010/0333053 | A1 * | 12/2010 | Goto | 716/106 |

* cited by examiner

Primary Examiner — Vuthe Siek
Assistant Examiner — Mohammed Alam
(74) Attorney, Agent, or Firm — WPAT PC; Justin King

(57) ABSTRACT

A change point finding method applied to a logic circuit is provided. The method first defines an indication map and performs a functional equivalent check to judge whether the indication map is correct. When a result is confirmative, the method adds a trap to an RTL HDL of the logic circuit, so that a plurality of comparing points are generated in an APR gate level HDL of the logic circuit. Then the method performs a backward functional equivalent check on the APR gate level HDL of the logic circuit to find a change point according to the comparing points.

20 Claims, 8 Drawing Sheets

```
module mpif_if_ctrl ( In1,...Out7);
input In1;
...
Output out7;
wire w1 = In2 & In3;
wire w2 = In3 | In4;
wire new_w1 = In4 & In5;
wire w3_trap = w1 & w2;
wire w3 = w1 & w2 & new_w1;
...
endmodule
```

CIRCUIT DESIGN CHANGE AND CORRESPONDENCE POINT FINDING METHOD BETWEEN HDL LAND RLT DESIGN

CROSS REFERENCE TO RELATED PATENT APPLICATION

This patent application is based on Taiwan, R.O.C. patent application No. 098114441 filed on Apr. 30, 2009.

FIELD OF THE INVENTION

The present invention relates to a logic circuit, and more particularly to a method and apparatus for quickly finding an engineering change order (ECO) point of a logic circuit.

BACKGROUND OF THE INVENTION

Accompanied with continual development of the electronic technology, various electronic products are becoming more and more versatile with overwhelmingly diversified functions. Therefore, innovated circuit designs of chips are also becoming more and more complicated in order to meet user requirements upon the electronic products.

In a conventional integrated circuit (IC) design flow, an engineering change order (ECO) is a back-end engineering change step. Supposing a logic circuit is established from a register transfer level (RTL) hardware description language (HDL), the RTL HDL is synthesized into a gate level HDL, and then converted into an optimized gate level HDL via automatic placement and routing (APR).

At the current phase, since the logic circuit has undergone synthesis and APR, all functional components included in the logic circuit are coupled to or merged with one another, or simplified, such that the logic circuit is able to pass timing constraints while also reducing its utilization area. As a result, modifications on the optimized gate level HDL of the logic circuit according to ECO become extremely challenging.

One of the greatest difficulties in ECO is that, in order to proceed with modifications on the optimized gate level HDL of the logic circuit, it is necessary to first perform a logical equivalent check between the RTL HDL and optimized gate level HDL of the logic circuit to ensure modifications made on the logic circuit are correct at both RTL HDL and optimized gate level HDL phases. More specifically, to make modifications according to ECO, it is necessary to repeatedly check between the synthesized gate level HDL and optimized gate level HDL phases and then perform detailed and complicated data import and export.

Accordingly, it is apparent that finding ECO points in the synthesized, optimized and APR gate level HDL of the logic circuit is much more difficult than finding those in the RTL HDL of the logic circuit. Such difficulties mean that a great amount time and resources are required for finding possible ECO points in the complicated APR gate level HDL of the logic circuit. Consequently, a progress of the entire IC design flow may be seriously affected to lead to delays in product manufacturing and time-to-market.

Therefore, it is an objective of the invention to provide a change point finding method and apparatus for overcoming the foregoing issues.

SUMMARY OF THE INVENTION

According to a first embodiment of the invention, a change point finding apparatus applied to a logic circuit is provided. In this embodiment, the logic circuit is first established from an RTL HDL, which is converted into a synthesized gate level HDL through synthesis and then converted into an APR gate level HDL through APR.

According to this embodiment, the change point finding apparatus comprises a defining module, a verification module, a comparing module and a checking module. The defining module, coupled to the logic circuit, defines an indication map that indicates a plurality of pins. The verification module, coupled to the defining module, performs a functional equivalent check on the indication map to judge whether the indication map is correct. The comparing module is coupled to the verification module and the logic circuit. When a judge result from the verification module is affirmative, the comparing module adds at least one trap into the RTL HDL of the logic circuit to generate a plurality of comparing points in the APR gate level HDL of the logic circuit. The checking module, coupled to the comparing module and the logic circuit, performs a backward functional equivalent check on the APR gate level HDL of the logic circuit according to the plurality of comparing points to find the change point in the APR gate level HDL.

According to a second embodiment of the invention, a change point finding method applied to a logic circuit is provided. In this embodiment, the logic circuit is first established from an RTL HDL, which is converted into a synthesized gate level HDL through synthesis and then converted into an APR gate level HDL through APR.

According to this embodiment, the change point finding method comprises defining an indication map, adding a trap to the RTL HDL in order to generate a plurality of comparing points when the indication map is determined as correct by performing a functional equivalent check, and performing a backward functional equivalent check on the APR gate level HDL according to the comparing points to find the change point in the APR gate level HDL. For example, the change point is an ECO point, and the at least one trap is an ECO change.

With the change point finding method and apparatus, by adding the trap (i.e., the ECO point) to the RTL HDL of the logic circuit, corresponding comparing points are generated in the APR gate level HDL of the logic circuit, and a possible range where the ECO point may be located is gradually limited using the limiting module of the change point finding apparatus. Accordingly, the change point finding apparatus is able to quickly find the needed ECO point from the APR gate level HDL of the logic circuit.

Therefore, through the change point finding method and apparatus of the invention, time and resources previously spent on finding possible ECO points in a complicated APR gate level HDL of a logic circuit according to the prior art are significantly reduced, so that efficiency of an overall IC design flow is optimized to prevent the back-end ECO in the IC design flow from delaying subsequent product manufacturing and time-to-market to enhance competitiveness.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

It is an objective of the invention to provide a change point finding method and a change point finding apparatus. With the invention, time and resources previously spent on finding possible ECO points in a complicated APR gate level HDL of a logic circuit according to the prior art are significantly reduced, so that efficiency of an overall IC design flow is optimized to prevent the back-end ECO in the IC design flow from delaying subsequent product manufacturing and time-to-market.

According to a first embodiment of the invention, a change point finding apparatus applied to a logic circuit is provided. For example, the change point is an ECO point. In this embodiment, the logic circuit is first established from a netlist in an RTL HDL, which is converted into a netlist in a synthesized gate level HDL through synthesis and then converted into a netlist in an APR gate level HDL through APR.

Figure 1:
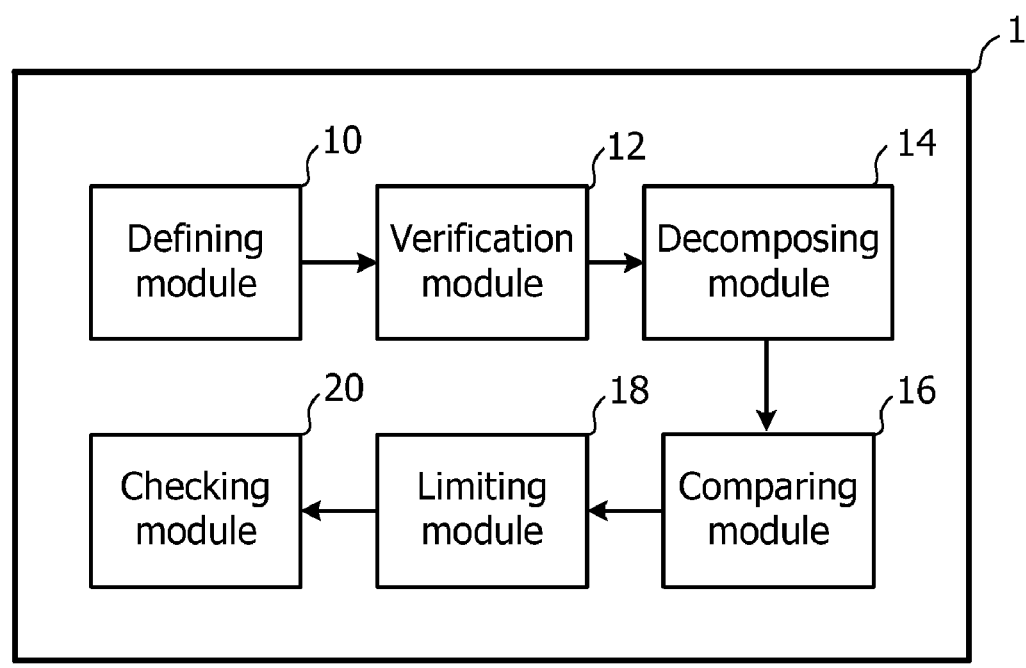
FIG. 1 is a functional block diagram of a change point finding apparatus according to the first embodiment of the invention.

FIG. 1 shows a functional block diagram of a change point finding apparatus according to the first embodiment of the invention. A change point finding apparatus 1 comprises a defining module 10, a verification module 12, a decomposing module 14, a comparing module 16, a limiting module 18 and a checking module 20. The verification module 12 is coupled to the defining module 10 and the decomposing module 14. The comparing module 16 is coupled to the decomposing module 14 and the limiting module 18. The checking module 20 is coupled to the limiting module 18. The defining module 10, the verification module 12, the decomposing module 14, the comparing module 16, the limiting module 18 and the checking module 20 are coupled to a circuit layout (not shown) to find an ECO point in the logic circuit.

Figure 2A:
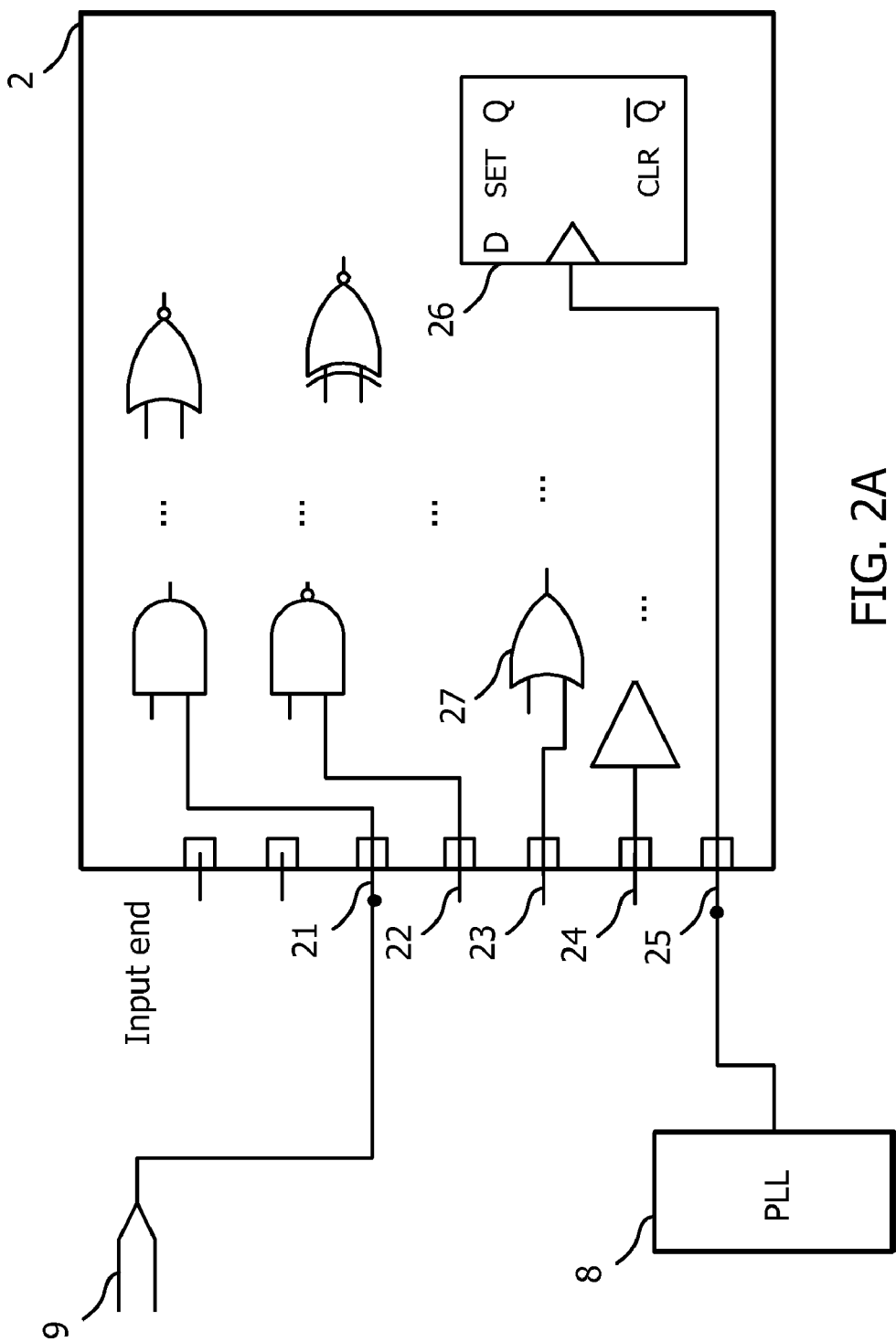
FIG. 2A are a schematic diagram of a function map of a synthesized gate level HDL.
Figure 2B:
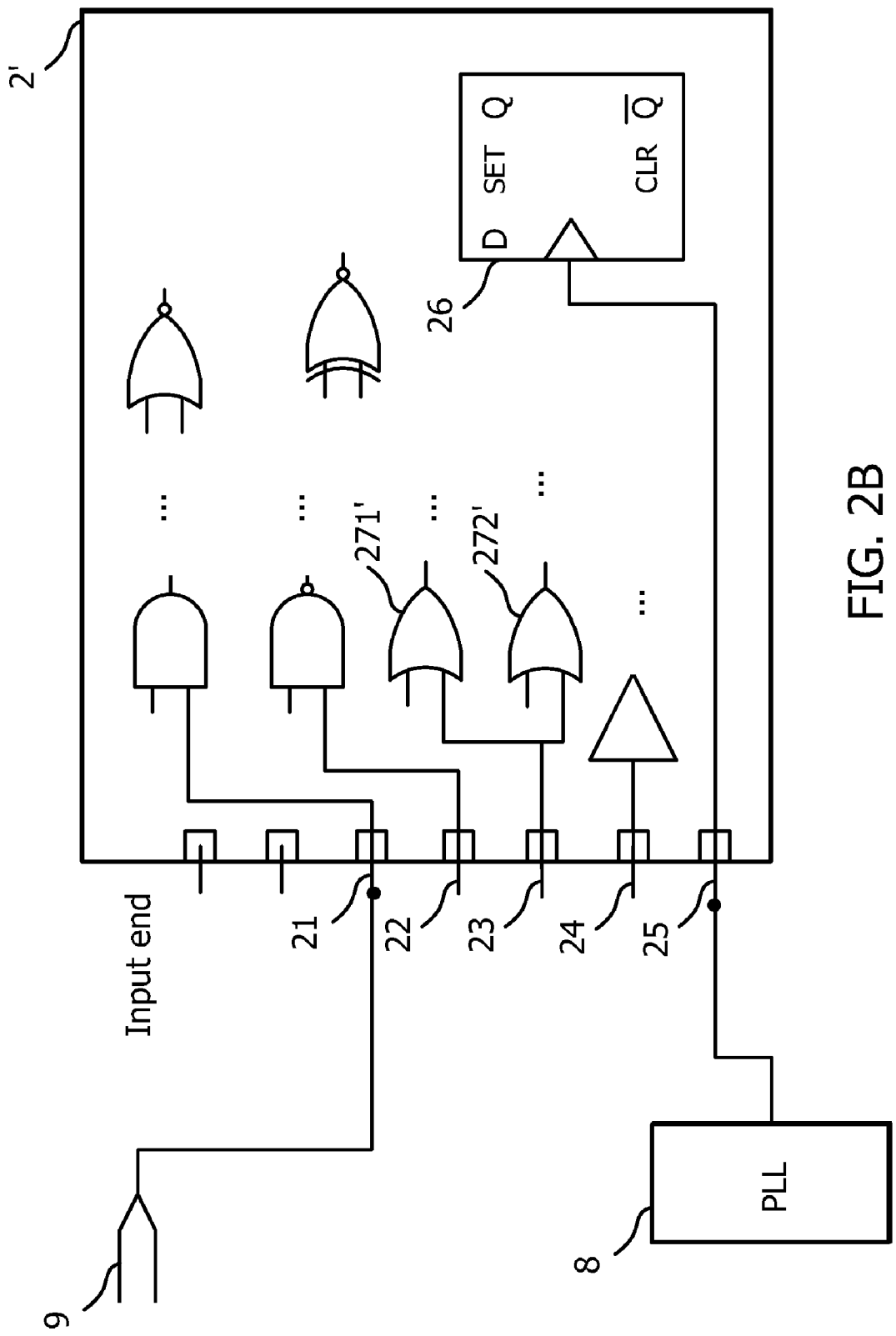
FIG. 2B shows a schematic diagram of a function map of an APR gate level HDL converted from the synthesized gate level HDL through APR.

Functions of the various modules of the change point finding apparatus 1 are to be discussed below. FIG. 2A shows a schematic diagram of a function map of a synthesized gate level HDL; FIG. 2B shows a schematic diagram of a function map of an APR gate level HDL converted from the synthesized gate level HDL through APR. As shown in FIG. 2A, a synthesized gate level HDL 2 of the logic circuit comprises a scan pin 21, a test pin 22, a data clone pin 23, a data inverter pin 24 and a clock pin 25. The scan pin 21 is coupled to a probe 9, and the clock pin 25 is coupled a phase locked loop (PLL) 8 and a flip-flop 26 in the logic circuit.

After undergoing an APR procedure, the synthesized gate level HDL in FIG. 2A becomes an APR gate level HDL 2' as shown in FIG. 2B. By comparing FIGS. 2A and 2B, according to this embodiment, an only difference between the synthesized gate level HDL 2 and the APR gate level HDL 2' is that, a logic component 27 originally coupled to the data clone pin 23 is decomposed into two logic components 271' and 272'.

In this embodiment, the defining module 10 of the change point finding apparatus 1 is for defining an indication map according to the synthesized gate level HDL 2 and the APR gate level HDL 2' to facilitate subsequent steps performed by the change point finding apparatus 1. For example, the indication map includes basic comparing point information, and thus the indication map in this embodiment may include position information of, e.g., the scan pin 21, the test pin 22, the data clone pin 23, the data inverter pin 24, the clock pin 25 and the flip-flop 26.

Next, the verification module 12 of the change point finding apparatus 1 performs a functional equivalent check on the indication map to judge whether the indication map is correct. In practice, the verification module 12 compares functions of the logic components of the synthesized gate level HDL 2 and the APR gate level HDL 2' to complete the functional equivalent check.

When a judge result from the verification module 12 is affirmative, that is, the verification module 12 verifies that the indication map is correct, the change point finding apparatus 1 continues with subsequent steps in searching for the change point.

In this embodiment, the comparison module 16 of the change point finding apparatus 1 adds at least one trap to the RTL HDL of the logic circuit to generate a plurality of comparing points in the ARP gate level HDL of the logic circuit. For example, the at least one trap is associated with an ECO point. More specifically, an ECO change point is added to the RTL HDL of the logic circuit, so that comparing points corresponding to the added ECO change point are generated in the ARP gate level HDL, which is converted from the RTL HDL of the logic circuit through synthesis and APR. For example, the comparing points may be selected from the output pins and an input pin of the flip-flop.

The limiting module 18 of the change point finding apparatus 1 then defines a fan-in cone according to the comparing points and judges whether functional components in within the fan-in cone satisfy a predetermined condition corresponding to the at least one trap.

In practice, the foregoing judgment procedure of the limiting module 18 is a so-called "fan-in cone function abort test" for excluding functional components that cannot be the change point to shorten a search time needed by the change point finding apparatus 1. When a judgment result from the limiting module 18 is affirmative, the limiting module 18 specifies the functional components satisfying the predetermined condition as functional components to be checked.

It is to be noted that, since the functional components to be checked are specified by the limiting module 18, the checking module 20, instead of checking all the functional components in the APR gate level HDL of the logic circuit, only needs to perform a functional equivalent check in a backward direction on the specified functional components to be checked, so that the time needed by the change point finding apparatus 1 for finding the change point is significantly reduced. In practice, it is possible that the change point finding apparatus 1 does not find any change points since the functional components to be checked do not assuredly comprise the change point that the change point finding apparatus 1 looks for.

Figures 3A, 3B:
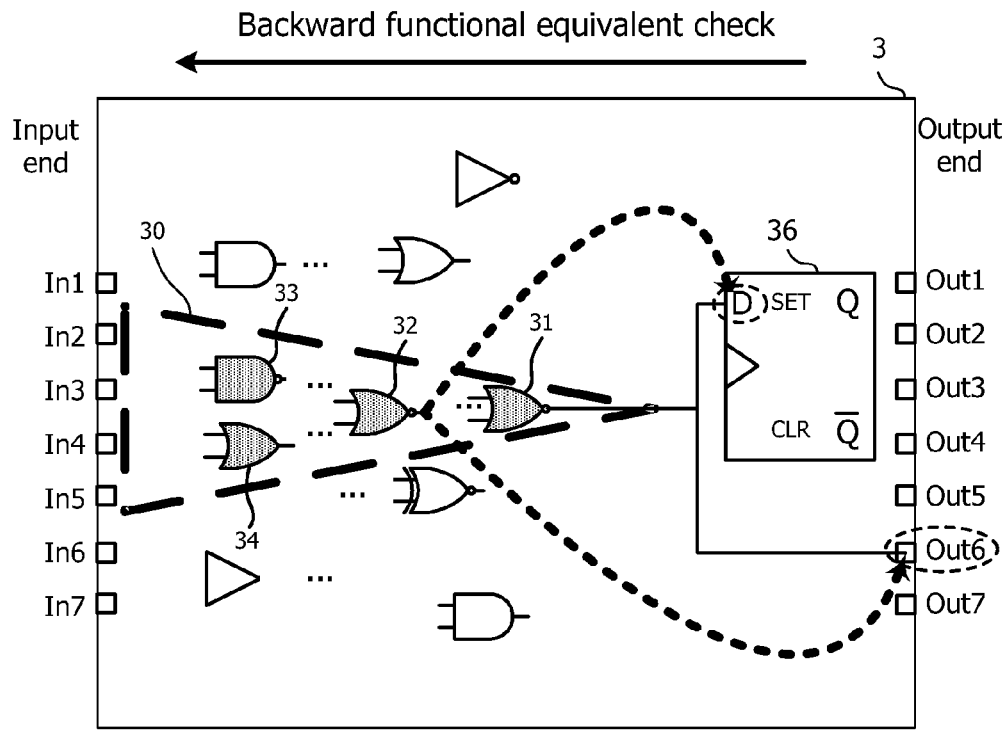
FIG. 3A is a schematic diagram of a description of a trap added to a code of the RTL HDL of the logic circuit.
FIG. 3B shows a schematic diagram of locating the comparing points from the APR gate level HDL of the logic circuit and defining the fan-in cone.

FIGS. 3A and 3B show an example of trying to locate comparing points in the ARP gate level HDL by adding a trap to the RTL HDL of the logic circuit. FIG. 3A shows a schematic diagram of a description of a trap (circled by the dotted line) added to a code of the RTL HDL of the logic circuit; FIG.

3B shows a schematic diagram of locating the comparing points from the APR gate level HDL of the logic circuit and defining the fan-in cone.

With reference to FIG. 3B, suppose the comparing points from a trap added to an APR gate level HDL 3 of a logic circuit by the comparing module 16 correspond to an output pin Out6 and an input end D of a flip-flop 36. The limiting module 18 then defines, in the ARP gate level HDL, a fan-in cone 30 which gradually narrows from an output end to an input end of the logic circuit.

In this embodiment, the fan-in cone 30 comprises logic components 30~34, and the limiting module 18 respectively performs a fan-in cone function abort test on the logic components 30~34 in a reverse direction, i.e., from its output end to its input end.

For example, with reference to the trap description in FIG. 3A, input pins corresponding to the functional components having the change point that the change point finding apparatus 1 looks for are (In2, In3, In4). Also, as shown in FIG. 3A, supposing input pins corresponding to the logic components 31~34 are (In2, In3, In4, In5), (In2, In3, In4), (In2, In4) and (In2, In3, In5). After comparisons by the limiting module 18, for that the logic components 33 and 34 do not include all input pins (In2, In3, In4), the limiting module 18 accordingly excludes the logic components 33 and 34, and specifies the logic components 31 and 32 as the functional components to be checked. Therefore, the checking module 20 only needs to perform a functional equivalent check on the logic components 31 and 32 to find out whether the APR gate level HDL of the logic circuit comprises the change point corresponding to the trap added by the comparing module 16.

Further, upon the verification module 12 verifying that the indication map is correct, before the comparing module 16 adds the trap to the RTL HDL of the logic circuit to generate the comparing points in the APR gate level HDL, the decomposing 14 judges whether the logic circuit comprises functional components with three or more than three input ends. When a result from the decomposing module 14 is affirmative, it means a certain logic component in the logic circuit has three or more than three input pins. At this point, the decomposing module 14 decomposes the functional component having three or more than three input ends to a plurality of functional components each having two input pins.

Figure 4A:
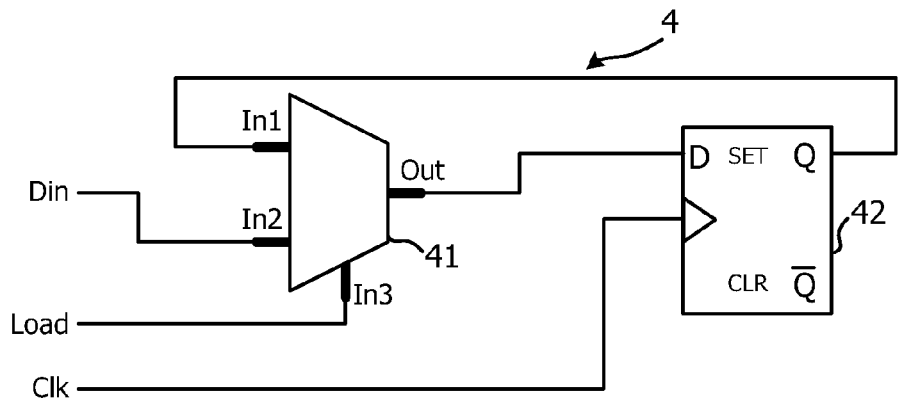
FIGS. 4A and 4B are schematic diagrams of a feedback multiplexer in an RTL HDL converted into an APR gate level HDL.
Figure 4B:
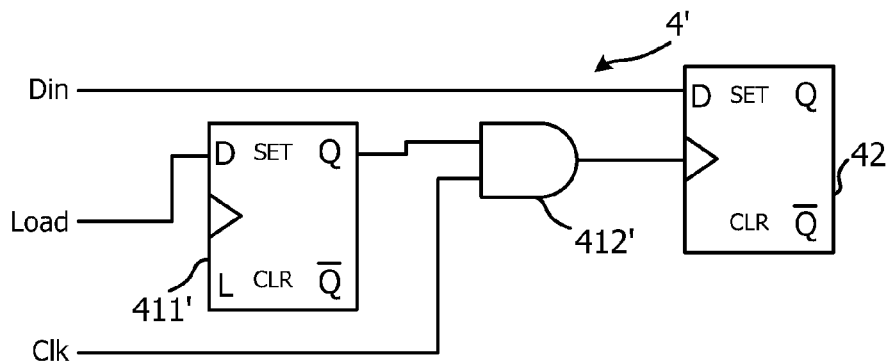

FIGS. 4A and 4B show schematic diagrams of a feedback multiplexer in an RTL HDL converted into an APR gate level HDL. As shown in FIG. 4A, a feedback multiplexer 41 in an RTL HDL 4 includes three input pins In1, In2 and In3, and an output pin Out. The output pin Out of the feedback multiplexer 41 is coupled to an input end D of a flip-flop 42, and the input pin in1 is coupled to an output end Q of the flip-flop 42. Therefore, the feedback multiplexer 41 transmits via the output pin Out an output signal to the flip-flop 42, and receives via the input pin In1 a feedback signal generated by the flip-flop 42.

The RTL HDL 4 in FIG. 4A is then converted to an integrated clock gating (ICG) in an APR gate level HDL 4', as shown in FIG. 4B. It is apparent that, when the decomposing module 14 of the change point finding apparatus 1 detects the feedback multiplexer 41 in the RTL HDL 4 includes three input pins In1, In2 and In3, the decomposing module 14 decomposes the multiplexer 41 into to functional components 411' and 412', each of which having two input pins, while the flip-flop 42 remains unchanged; however, coupling relationships between the various components are slightly different. In this embodiment, the functional component 411' is an inverter. In practice, the foregoing functional components are selected based on actual circuit requirements, and may be, for example, multipliers or adders.

Figure 4C:
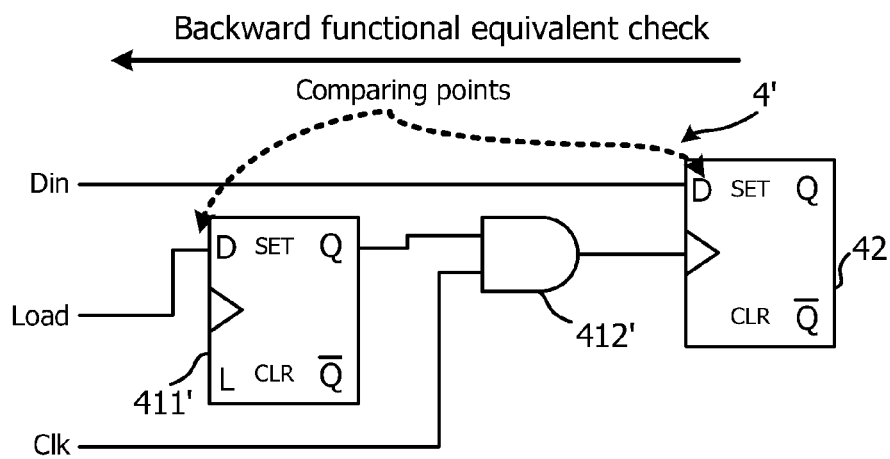
FIG. 4C is a schematic diagram of performing a fan-in cone function abort test on the APR gate level HDL in FIG. 4B.

FIG. 4C shows a schematic diagram of performing a fan-in cone function abort test on the APR gate level HDL 4' in FIG. 4B. As shown, when the limiting module 18 of the change point finding apparatus 1 performs a fan-in cone function abort test on the APR gate level HDL 4' in a reverse direction, the comparing points include an input end D of the flip-flop 411' in additional to the input end D of the flip-flop 42.

Figure 5A:
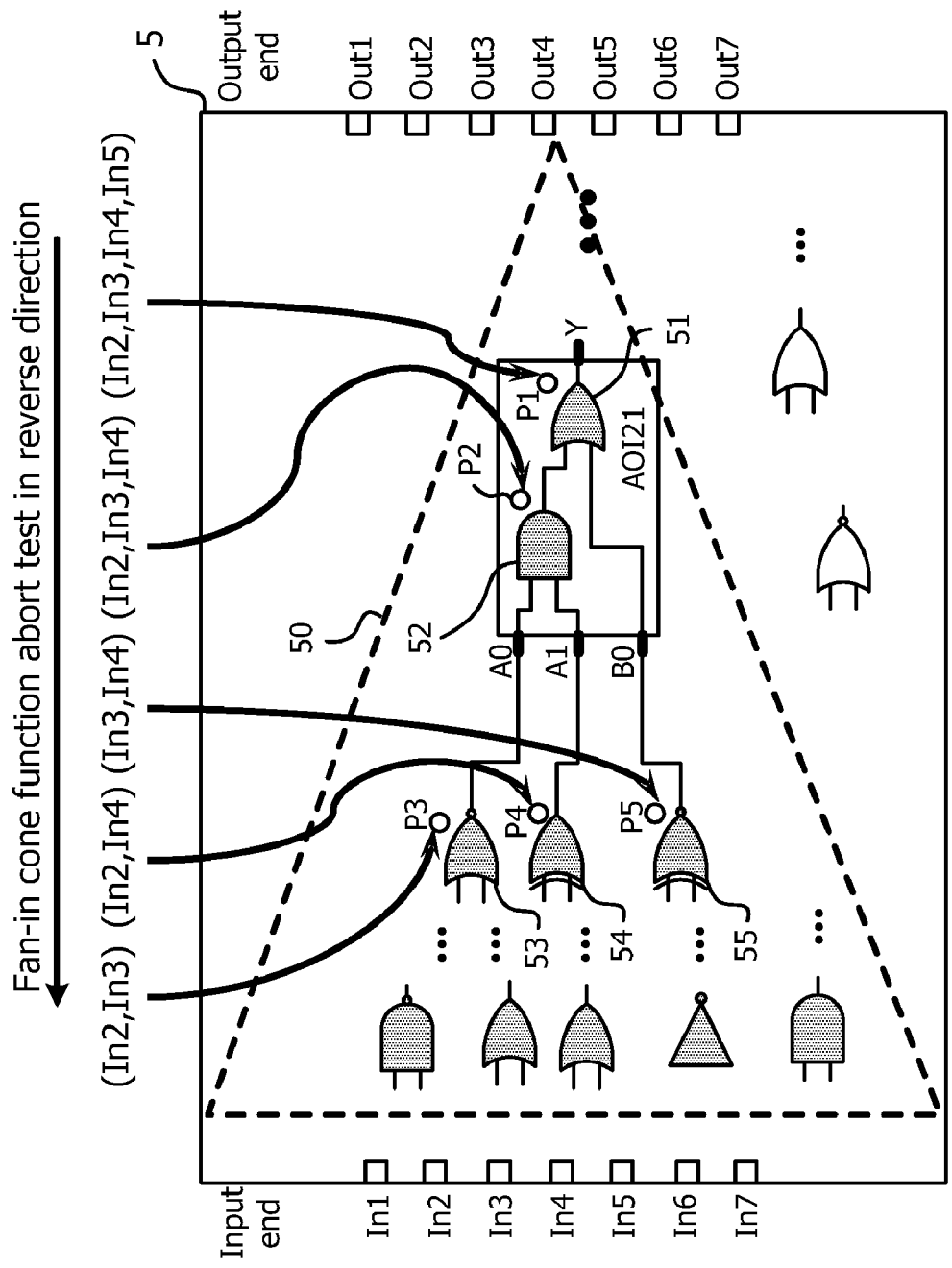
FIGS. 5A and 5B are schematic diagrams of performing a fan-in cone function abort test on an APR gate level HDL of different logic circuits.

The fan-in cone function abort test according to this embodiment shall be discussed in detail. FIG. 5A shows a schematic diagram of fan-in cone function abort test on an APR gate level HDL of a logic circuit. As shown, in an APR gate level HDL 5, the limiting module 18 defines a fan-in cone 50 comprising logic components 51~55, which respectively correspond to test points P1~P5. The limiting module 18 then performs a fan-in cone function abort test on the test points P1~P5 within the fan-in cone 50 in a reverse direction. Supposing change points that the change point finding apparatus 1 looks for correspond to input pins (In2, In3, In4), among the test points P1~P5, only the test points P1 and P2 shall to pass the test while the test points P3~P5 fail. Thus, the limiting module 18 excludes the logic components 53~55, and specifies the logic components 51 and 52 as the logic components to be checked.

It is to be noted that, the logic components 51 and 52 that pass the fan-in cone function abort test construct a circuit module AOI21, which has an output pin Y, and input pins A0, A1 and B0. The circuit module AOI21 is for multiplying signals inputted at the input pins A0 and A1 and adding the product to a signal inputted at the input pin B0; that is, a signal outputted from the output pin Y is (A0\*A1)+B0. In practice, a function map of the circuit module AOI21 is stored in a database (not shown) of the change point finding apparatus 1. When the decomposing module 14 is to decompose a function component having three or more than three input ends, the decomposing module 14 searches whether the database contains a corresponding function map to serve as a reference for the fan-in cone function abort test.

Figure 5B:
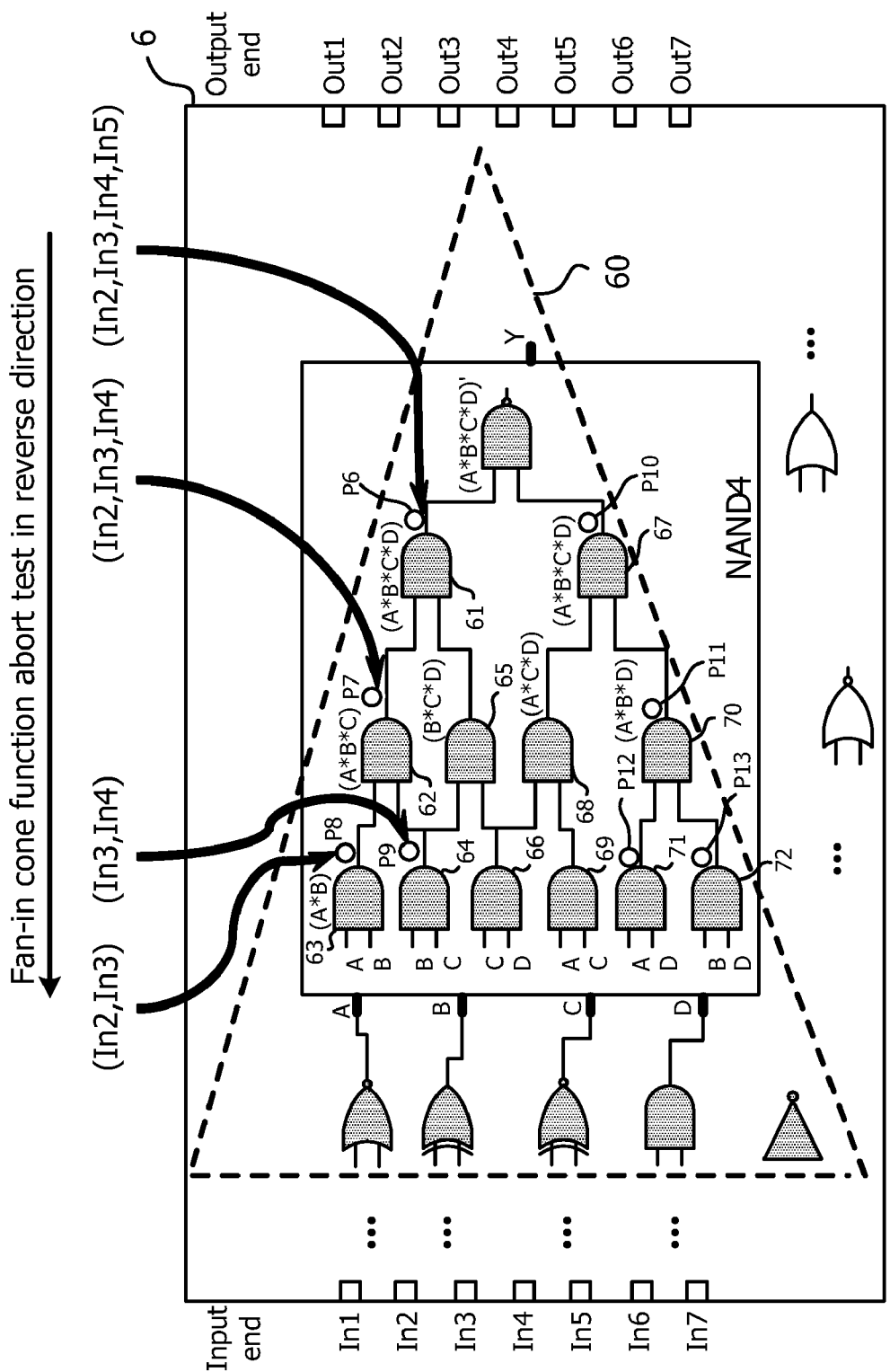

FIG. 5B shows a schematic diagram of fan-in cone function abort test on an APR gate level HDL of another logic circuit. As shown, in an APR gate level HDL 6, the limiting module 18 defines a fan-in cone 60 comprising logic components 61~72, of which the logic components 61~64 respectively correspond to test points P6~P9 and the logic components 67 and 70~72 respectively correspond to test points P10~P13. The limiting module 18 then performs a reverse fan-in cone function abort test on the test points P6~P9 within the fan-in cone 60. Supposing change points that the change point finding apparatus 1 looks for correspond to input pins (In2, In3, In4), among the test points P6~P9, only the test points P6 and P7 shall pass the test while the test points P8 and P9 fail. Thus, the limiting module 18 excludes the logic components 64 and 64, and specifies the logic components 61 and 62 as the logic components to be checked.

Similarly, the limiting module 18 also performs a fan-in cone function abort test on the test points P10~P13 within the fan-in cone 60 in a reverse direction. Supposing change points that the change point finding apparatus 1 looks for correspond to input pins (In2, In3, In5), among the test points P10~P13, only the test points P10 and P11 shall pass the test while the test points P12 and P13 fail. Thus, the limiting module 18 excludes the logic components 71 and 72, and specifies the logic components 67 and 70 as the logic components to be checked. Other logic components within the fan-in cone 60 are tested similarly, and the related description shall be omitted for brevity.

The foregoing logic components 61~72 are parts of a circuit module NAND4, as shown in FIG. 5B. The circuit module NAND4, comprising an output pin Y and input pins A~D, is for multiplying and inversing signals inputted at the input pins A~D; that is, an output signal from the output pin is (A*B*C*D)'. Similarly, a function map of the circuit module NAND4 is stored in the database of the change point finding apparatus 1. When the decomposing module 14 is to decompose a function component having three or more than three input ends, the decomposing module 14 searches whether the database contains a corresponding function map to serve as a reference for the fan-in cone function abort test.

According to a second embodiment of the invention, a change point finding method applied to a logic circuit is provided. In this embodiment, the logic circuit is first established from an RTL HDL, which is converted into a synthesized gate level HDL through synthesis and then converted into an APR gate level HDL through APR. The change point that the change point finding method looks for may be an ECO point, but is not limited thereto.

Figure 6:
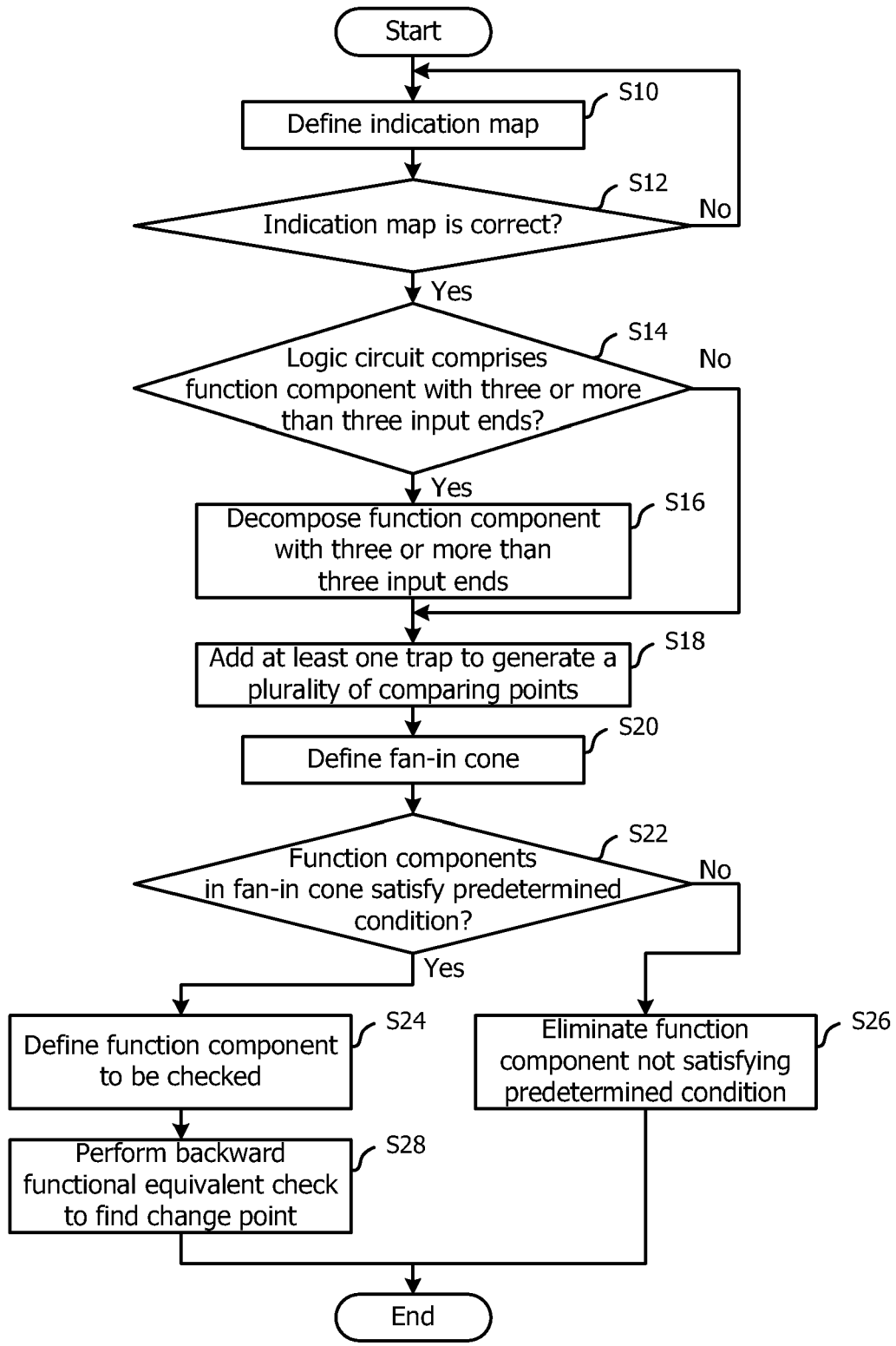
FIG. 6 is a flowchart of a change point finding method according to a second embodiment of the invention.

FIG. 6 shows a flowchart of a change point finding method according to the second embodiment of the invention. The method starts with Step S10 of defining an indication map. In this embodiment, the indication map indicates a plurality of pins of the logic circuit.

In practice, input ends of the logic circuit include, for example, a clock pin, a test pin, a scan pin, a data clone pin and a data inverter pin. For example, the indication map may include basic comparing point information, and thus the indication map in this embodiment may but not limited to include position information of the scan pin, the test pin, the data clone pin, the data inverter pin, the clock pin and the flip-flop.

The change point finding method then proceeds to Step S12 of performing a functional equivalent check to judge whether the indication map is correct. When a result from Step S12 is affirmative, Step S14 is followed to determine whether the logic circuit comprises a functional component having three or more than three input ends. When a result from Step S14 is affirmative, it means the logic circuit comprises a functional component having three or more than three input ends, and Step S16 is performed. In Step S16, The functional component having three or more than three input ends is decomposed into a plurality of functional components each having two input ends.

In next Step S18, at least one trap is added into the RTL HDL of the logic circuit to generate a plurality of comparing points in the APR gate level HDL of the logic circuit. For example, the at least one trap is associated with an ECO change point. Further, the logic circuit comprises a plurality of output pins and an inverter, and the plurality of comparing points are chosen from, for example, the plurality of output pins and an input end of the inverter.

After Step S18, Step S20 is performed to define a fan-in cone according to the comparing points, wherein the fan-in cone gradually narrows from an output end to an input end of the logic circuit. In Step S22, it is judged whether functional components within the fan-in cone satisfy a predetermined condition corresponding to the at least one trap. When a result from Step S22 is affirmative, Step S24 is followed to specify the functional components satisfying the predetermined condition as functional components to be checked. Therefore, according to the method, a functional equivalent check is performed only on the specified functional components to be checked to quickly determine whether the APR gate level HDL of the logic circuit contains change points corresponding to the at least one trap added in Step S18. When a result from Step S22 is affirmative, Step S26 is performed to exclude the functional components that do not satisfy the predetermined condition.

In Step S28, a backward functional equivalent check is performed on the APR gate level HDL of the logic circuit according to the plurality of comparing points to find the change point in the ARP gate level HDL. More specifically, a functional equivalent check is performed on the components to be checked within the fan-in cone in a backward direction to find the change point from the functional components to be checked.

With the change point finding method and apparatus, by adding the trap (i.e., the ECO point) to the RTL HDL of the logic circuit, corresponding comparing points are generated in the APR gate level HDL of the logic circuit, and a possible range where the ECO point may be located is gradually limited using the limiting module of the change point finding apparatus. Accordingly, the change point finding apparatus is able to quickly find the needed ECO point from the APR gate level HDL of the logic circuit.

Therefore, through the change point finding method and apparatus of the invention, time and resources previously spent on finding possible ECO points in a complicated APR gate level HDL of a logic circuit according to the prior art are significantly reduced, so that efficiency of an overall IC design flow is optimized to prevent the back-end ECO in the IC design flow from delaying subsequent product manufacturing and time-to-market to enhance competitiveness.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method, for finding a change point applied to a logic circuit, the logic circuit derived from a register transfer level (RTL) hardware description language (HDL), converted into a synthesized gate level HDL through synthesis and converted into an automatic placement and routing (APR) gate level HDL through APR, the method comprising:
    defining an indication map, for indicating a plurality of pins; performing a functional equivalent check on the indication map to judge whether the indication map is correct;
    adding a trap to the RTL HDL in order to generate a plurality of comparing points when the indication map is determined as correct by performing a functional equivalent check; and
    performing a backward functional equivalent check on the APR gate level HDL according to the comparing points to find the change point in the APR gate level HDL by a computer.

2. The method as claimed in claim 1, wherein the change point is an engineering change order (ECO) point.

3. The method as claimed in claim 1, after the step of judging whether indication map is correct, further comprising:
    decomposing a functional component having three or more than three of input ends into a plurality of functional components each having two input ends when the logic circuit is judged as comprising a functional component having three or more than three of input ends.

4. The method as claimed in claim 1, wherein input ends of the logic circuit comprise a clock pin, a test pin, a scan pin, a data clone pin and a data inverter pin.

5. The method as claimed in claim 4, wherein the indication map comprises location information of the clock pin, the test pin, the scan pin, the data clone pin and the data inverter pin.

6. The method as claimed in claim 1, wherein the logic circuit comprises a plurality of output pins and a flip-flop, and the plurality of comparing points are chosen from the plurality of output pins and an input pin of the flip-flop.

7. The method as claimed in claim 1, after the step of adding the trap, further comprising:
defining a fan-in cone in the logic circuit according to the comparing points, wherein the fan-in cone gradually narrows from an input end to an output end of the logic circuit; and
specifying functional components within the fan-in cone as functional components to be checked when the functional components within the fan-in cone satisfy a predetermined condition corresponding to the added trap.

8. The method as claimed in claim 7, wherein in the step of performing the backward functional equivalent check, the functional equivalent check is performed on the functional components to be checked in a backward direction to find the change point from the functional components.

9. The method as claimed in claim 1, wherein the trap is associated with an ECO point.

10. An apparatus for finding a change point, applied to a logic circuit; the logic circuit derived from an RTL HDL, converted into a synthesized gate level HDL through synthesis and converted into an APR gate level HDL through APR; the apparatus comprising:
a defining module, coupled to the logic circuit, for defining an indication map that indicates a plurality of pins;
a verification module, coupled to the defining module and the logic circuit, for performing a functional equivalent check on the indication map to judge whether the indication map is correct;
a comparing module, coupled to the verification module and the logic circuit, for adding a trap to the RTL HDL of the logic circuit when the verification module judges that the indication map is correct to generate a plurality of comparing points in the APR gate level HDL; and
a checking module, coupled to the comparing module and the logic circuit, for performing a backward functional equivalent check on the APR gate level HDL to find the change point in the APR gate level HDL.

11. The apparatus as claimed in claim 10, wherein the change point is an ECO point.

12. The apparatus as claimed in claim 10, further comprising:
a decomposing module, coupled to the verification module, the comparing module and the logic circuit, for judging whether the logic circuit comprises a component having three or more than three input ends, and decomposing the functional component having three or more than three input ends into a plurality of functional components each having two input ends.

13. The apparatus as claimed in claim 10, wherein input ends of the logic circuit comprise a clock pin, a test pin, a scan pin, a data clone pin and a data inverter pin.

14. The apparatus as claimed in claim 13, wherein the indication map comprises location information of the clock pin, the test pin, the scan pin, the data clone pin and the data inverter pin.

15. The apparatus as claimed in claim 10, wherein the logic circuit comprises a plurality of output pins and a flip-flop, and the plurality of comparing points are chosen from the plurality of output pins and an input pin of the flip-flop.

16. The apparatus as claimed in claim 10, further comprising:
a limiting module, coupled to the comparing module, the checking module and the logic circuit, for defining a fan-in cone in the logic circuit and judging whether functional components with the fan-in cone satisfy a predetermined condition, and specifying the functional components satisfying the predetermined condition as functional components to be checked when a judge result is affirmative.

17. The apparatus as claimed in claim 16, wherein the fan-in cone gradually narrows from an input end toward an output end of the logic circuit.

18. The apparatus as claimed in claim 16, wherein the predetermined condition corresponds to the added trap.

19. The apparatus as claimed in claim 16, wherein the checking module performs the functional equivalent check on the functional components to be check within the fan-in cone in a backward direction to find the change point form the functional components to be checked.

20. The apparatus as claimed in claim 10, wherein the trap is associated with the ECO.

* * * * *